United States Patent [19]

Fiset

[11] Patent Number: 5,421,005
[45] Date of Patent: May 30, 1995

[54] ALTERNATE DRAM REFRESH CONTROLLED BY SIGNAL PERIOD DETECTOR

[76] Inventor: Peter D. Fiset, 5 Upper Loudon Rd., Loudonville, N.Y. 12211

[21] Appl. No.: 984,358

[22] Filed: Dec. 2, 1992

[51] Int. Cl.[6] .................. G06F 11/34; G06F 7/02; G06F 7/22
[52] U.S. Cl. .................. 395/575; 364/246.9; 364/DIG. 1; 364/964.9; 364/DIG. 2
[58] Field of Search .............. 395/575, 425; 364/964.9, 246.91; 365/189.01, 222, 227, 228; 371/21.1

[56] References Cited

U.S. PATENT DOCUMENTS

| | | | |
|---|---|---|---|
| 4,901,283 | 2/1990 | Hanbury et al. | 365/222 |
| 4,977,537 | 12/1990 | Dias et al. | 364/900 |
| 5,089,987 | 2/1992 | Nakao et al. | 365/222 |
| 5,241,680 | 8/1993 | Cole et al. | 365/246.91 |
| 5,283,885 | 2/1994 | Hollerbauer | 365/964.9 |

Primary Examiner—Robert W. Beausoliel, Jr.
Assistant Examiner—T. Tu
Attorney, Agent, or Firm—Richard C. Litman

[57] ABSTRACT

A signal period detection circuit detects the period of clock signals and generates a control signal for computer memory. The control signal is used in conjunction with an alternate refresh circuit that provides alternate refresh control signals to DRAM when the computer is not properly operating. When the clock period varies from normal operating parameters, the control signal is sent to the alternate refresh circuit to supply continuous refresh and power signals to the DRAM.

20 Claims, 2 Drawing Sheets

ALTERNATE DRAM REFRESH CONTROLLED BY SIGNAL PERIOD DETECTOR

BACKGROUND-FIELD OF INVENTION

The present invention relates to computer systems and, specifically to computer systems employing dynamic random access memory ("DRAM") expansion subsystems.

BACKGROUND-DESCRIPTION OF PRIOR ART

DRAM requires refreshing to maintain the integrity of the data stored in the dynamic memory cells. The existence or lack of charge stored in the capacitance of each cell represents the information stored. This charge decays or increases due to parasitic semiconductor structures within the memory cell. Therefore the cell must be charged or discharged repeatedly at a predetermined rate in order to maintain the information.

Unless a DRAM receives refresh signals and power, the stored data will be lost. Therefore, if the computer system is turned off, the DRAM information will be lost. It would be advantageous for the DRAM to continue to be refreshed to maintain the data for later use. In general the refresh control signals a called column address strobe (CAS*) and row address strobe (RAS*) where the asterisk represents an active low signal.

Enhanced versions of DRAM from the size 256K bit and higher have a preferred refresh scheme where the refresh counter resides on the DRAM. Such DRAMs require a CAS* before RAS* refresh such that both RAS* and CAS* are released for a prescribed time after which CAS* is asserted and after a prescribed time RAS* is asserted. This sequence generates a refresh of the row of cells the internal counter is addressing. After another prescribed time both CAS* and RAS* are released. This cycle will continue and the DRAM will remain refreshed.

A type of preferred refresh similar to the CAS* before RAS* refresh is the hidden refresh cycle in which RAS* and CAS* are first released. RAS* is then asserted and after a prescribed time CAS* is asserted activating a read or write of data to the DRAM. After a prescribed time RAS* is released and after a prescribed time RAS* is again asserted while CAS* remains asserted. The last assertion of RAS* initiates a CAS* before RAS* internal refresh. An example of another less desirable refresh scheme would be a DRAM memory management circuit in which the refresh was performed as row address accesses in a burst mode. That is there would be long periods where RAS* and CAS* were not cycled after which time a refresh of the entire DRAM is performed by an external device accessing each row address of the DRAM.

The most common situation for the refresh of DRAMs is a continuous refresh of the CAS* before RAS* type as opposed to a burst type refresh. This is the case because a burst type refresh precludes access to the memory and would degrades overall system performance.

DRAM can continue to be refreshed after the computer system to which it is attached is shut down, provided there is an alternate method of supplying refresh signals, which includes alternate power, to the DRAM. A key element in supplying alternate refresh signals is determining when to invoke the alternate signals. That is, the computer systems signals should be used to access and refresh the DRAM up until the computer is no longer operating at which time the alternate signals are supplied.

Prior art shows DRAM refresh backup circuits that use deviations in the computers power supply voltage from a predetermined voltage to invoke the alternate refresh signals. Such claims can be found in U.S. Pat. No. 4,901,283 to Hanbury et al. (1990) and U.S. Pat. No. 4,977,537 to Dias et al. (1990). The disadvantage with detecting just the power supply voltage level is that the period of the refresh signals supplied to the DRAMs could become out of specification prior to the system power supply voltage deviating. The condition where the refresh or system clock signals deviates yet the power supply remains valid will cause loss of data in the DRAM.

SUMMARY OF THE INVENTION

Maintenance of the data in the DRAM requires a minimum power supply voltage and proper refresh control signals. Therefore, in addition to monitoring the power supply voltage, the period of the signals controlling the DRAM refresh mechanism must also be monitored.

The present invention improves on the supply of alternate refresh signal and power by detecting deviations in the period and of computer system signals that support the DRAMs. A deviation in the frequency of the system signals implies an impending shutdown which causes the period signal detector to initiate a switch between the system refresh and power signals and the alternate refresh and power signals.

DRAWING FIGURES

Figure 1A:
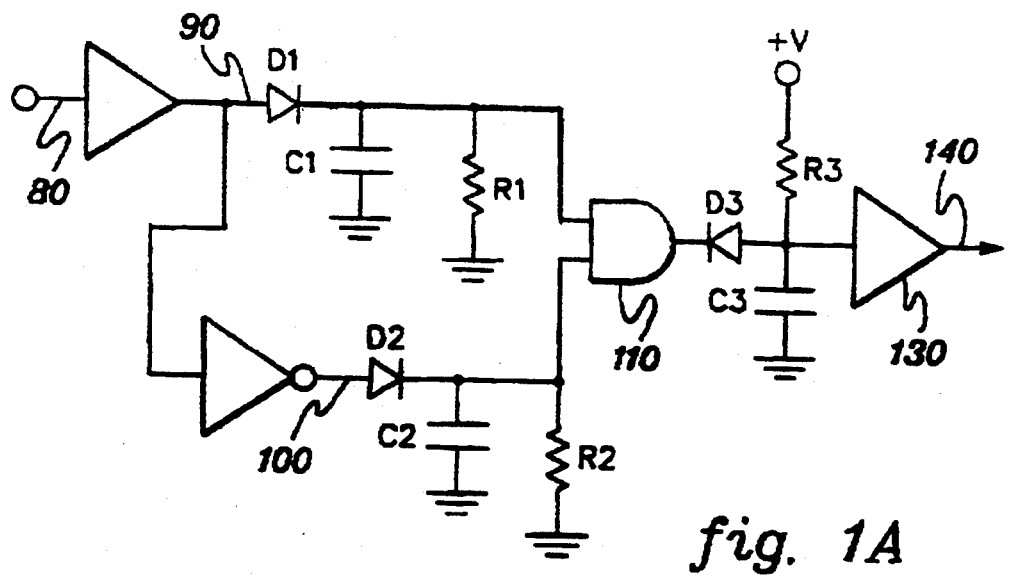
FIG. 1A shows the circuit of a preferred embodiment of the signal period deviation detector.

REFERENCE NUMERALS IN DRAWINGS 10 signal period deviation detector
20 computer system bus connector
30 alternate power supply
40 alternate computer system bus controller
50 alternate computer system bus connector
60 alternate DRAM controller
70 DRAM connector
80 main system clock
90 buffered signal
100 complement buffered signal
110 logic AND gate
120 detect signal
130 buffer
140 control signal

DESCRIPTION AND EMBODIMENT OF THE INVENTION

The present invention will be described with reference to specific preferred embodiments thereof. However, it should be noted that these embodiments can be very widely modified and varied. The scope of the invention, as will readily be recognized by those skilled in the art, can be modified and varied to be incorporated in a tremendous variety of system contexts.

Figure 2:
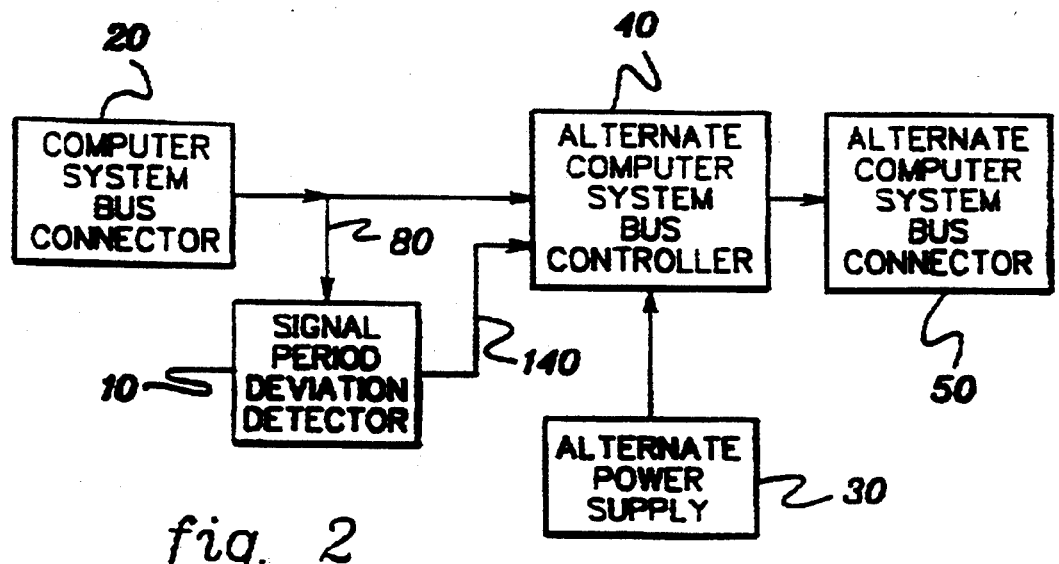
FIG. 2 shows an embodiment of the signal period deviation detector for use in providing alternate signals to a system bus.

Referring to FIG. 2, one preferred embodiment of the invention is shown to contain a signal period deviation detector 10, connected to a computer system bus connector 20, and connected to an alternate computer system bus controller 20. The alternate computer system bus connector 50 has the same signals as the computer system bus connector 20, with a few modifications. The modifications being the alternate computer system bus connector 50 has active signals that continue after the computer has been shut down. These signals are generated by the alternate computer system bus controller 40 to provide all the necessary control and timing signals for the continued operation of a DRAM controller attached to the alternate computer system bus connector. In addition an alternate power supply 30 is connected to the alternate computer system bus controller zig so that power can be supplied to the signal period deviation detector 10 and the alternate computer system bus connector 50. The alternate power supply 30 is connected to the alternate computer system bus controller 40. The alternate computer system bus controller 40 includes a connection (not shown) for supplying power to the alternate computer system bus connector 50 and the signal period deviation detector 10.

Figure 3:
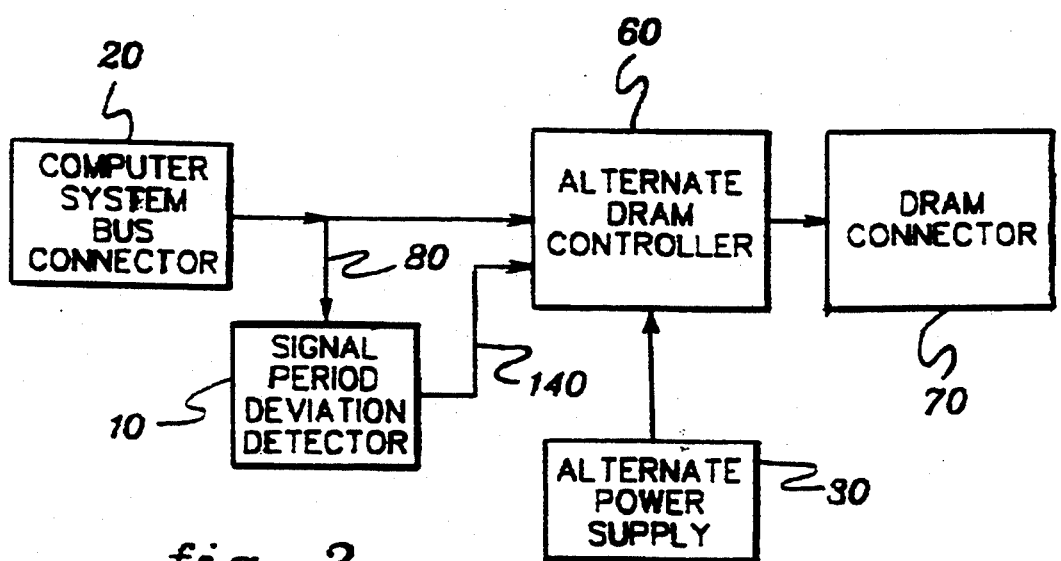
FIG. 3 shows an embodiment of the signal period deviation detector for use with a DRAM controller.

Another embodiment of the invention is shown in FIG. 3. In this embodiment the invention is shown to contain the signal period deviation detector 10, connected to a computer system bus connector 20, and connected to an alternate DRAM controller 60. In such a situation an alternate DRAM controller 60 is used to generate all the required signals to operate the DRAM connected via DRAM connector 70. When the computer is operating the signal period deviation detector 10 controls the alternate DRAM controller 60 to generate signals in response to access signals from the computer system bus connector 20. When the computer shuts down the signal period varies and ultimately disappears altogether. When this occurs the signal period deviation detector 10 senses the variation in signal period and controls the alternate DRAM controller 60 to switch to backup mode where DRAM control signals are generated to keep the data in the DRAM valid. The alternate power supply 30 is connected to the alternate DRAM controller 60. The alternate DRAM controller 60 includes a connection (not shown) for supplying power to the DRAM connector 70 and the signal period deviation detector 10.

The preferred embodiment shown includes the situation where only a DRAM connector 70 exists, because many memory expansion products are manufactured and sold without DRAM. The DRAM is installed later by the user.

Figure 1B:
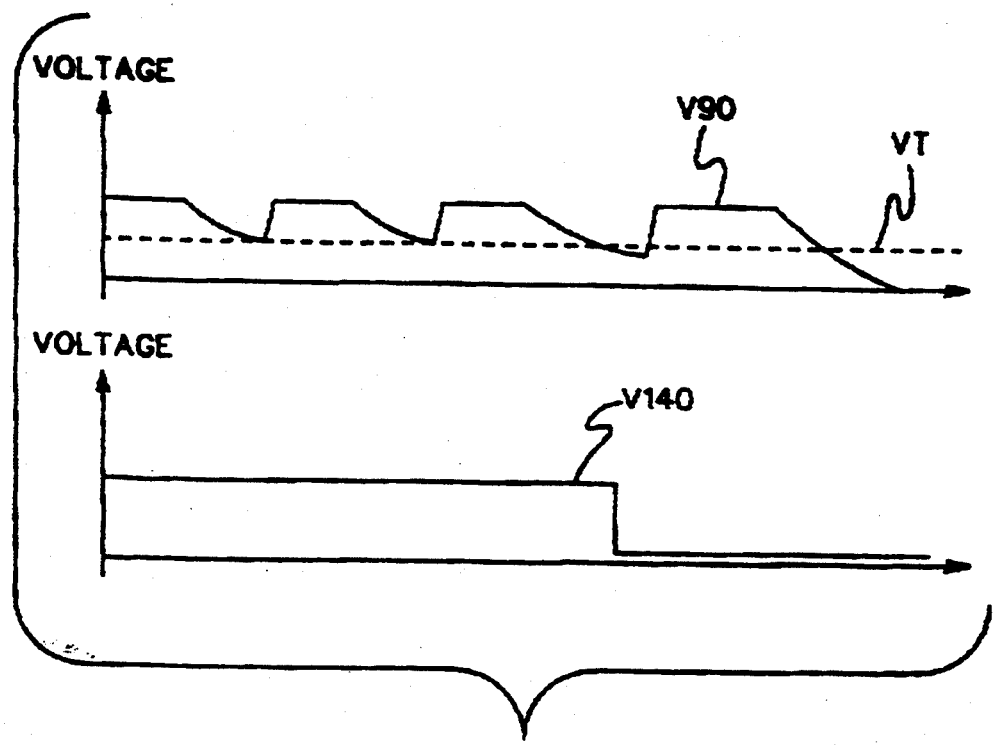
FIG. 1B shows voltage waveforms of the signal period deviation detector circuit.

The signal period deviation detector 10 has a circuit of the form shown in FIG. 1A. Here the preferred signal is the main system clock 80. The clock signal is buffered to produce logical compliments 90 and 100, with a stable supply voltage and a low impedance current source to supply the capacitors C1 and C2 through diodes D1 and D2 respectively. The current from the capacitors will leak off to ground through the resistors R1 and R2 respectively. The R1C1 and R2C2 time constants are selected based on the switching threshold voltage VT of the logic gate 11 and the period at which detected is desired. The charge flows into the capacitors C1 and C2 each cycle. The charge then leaks off the capacitor each cycle producing a saw-tooth type waveform VaO shown in FIG. 1B.

The circuit shown is useful in detecting a signal period variations for each and every cycle of the signal.

The complement of the signal is not required when the signal slows down gradually. Both the signal and the complement of the signal are used in the preferred embodiment because if the computer clock stopped cycling instantly and remained either high or low then a detection could not occur without the complement signal.

A brief detection event requires a circuit that can lengthen the detect signal 120 into a useful period such that the system can be switched into the alternate or backup mode. Also, the extension of the brief detection event is required to allow the system to come to a stable operating frequency when the computer is turned back on or becomes operational in the future. Therefore the circuit comprising R3, D3, and D2 and buffer 130 is used to generate a longer control signal V140, shown in FIG. 1B.

The use of RAS* or CAS* as the input signal to the signal period deviation detector would not be suitable in a system that uses burst mode row address refreshing because the signal period deviation detector expects a valid period on every cycle. The long period of dormancy between burst refreshing would cause a false signal variation detection. In such cases the system clock would be the preferred source of input for the signal deviation detector. For this reason CLOCK 80 is shown in the preferred embodiment of the invention.

Any other signal on which the DRAM depends for refresh would be a suitable input to the signal period variation detector. Very often either CAS* or RAS* is cycled continuously while the other signal is gated and controlled to produce the access and refresh scheme. In this case the continuously cycled signal would be a candidate as the input to the signal period deviation detector.

In addition a plurality of signals could be used in conjunction with a plurality of signal period variation detectors to produce a safer detection, where any one of several signal period variations could set the invention into backup mode.

It will be recognized by those skilled in the art that a tremendous variety of modifications and variations may be introduced in the presently preferred embodiment. For example, many different memory chip sizes, and memory module configurations, could be used. In addition, the present invention can also be adapted to provide nonvolatile operation in refreshable dynamic circuits other than DRAMs.

What I claim is:

1. A controller system comprising:
   (a) a DRAM connector,
   (b) a computer system bus connector,
   (c) a signal period detection means for generating a control signal defining a computer system operating properly condition, and defining a computer system not operating properly condition, wherein said signal period detection means generates said control signal in response to a computer system signal from said computer system bus connector, wherein said computer system operating properly condition is detected when said computer system signal is within a set of prescribed limits,
   (d) an alternate Dram control means responsive to said control signal for sending a first set of DRAM signals during said computer system operating properly condition, and for producing a second set of DRAM signals during said computer system not operating properly condition to said DRAM connector.

2. A system according to claim 1 wherein said alternate DRAM control means further includes an alternate power connection for providing alternate power to said DRAM connector and to said signal period detection means during said computer system not operating properly condition.

3. A system according to claim 1 further comprising a DRAM connected to said DRAM connector.

4. A system according to claim 1 wherein said signal period detecting means includes a plurality of signal period detectors for detecting the periods of a plurality of system signals including said computer system signal.

5. A system according to claim 1 wherein said alternate DRAM control means produces said first and second set of DRAM control signals such that a transition from said first to said second set of DRAM control signals maintains proper DRAM control signal timing requirements.

6. A system according to claim 1 wherein said alternate DRAM control means produces said first and second set of DRAM control signals such that a transition from said second to said first set of DRAM control signals maintains proper Dram control signal timing requirements.

7. A system according to claim 1 wherein said alternate DRAM control means produces said first set of DRAM signals in response to said computer system signal supplied from said computer system bus connector which allows the computer system to access the DRAM.

8. A system according to claim 1 further wherein said computer system signal is a clock signal.

9. A controller system comprising:
(a) a computer system bus connector,
(b) an alternate computer system bus connector,
(c) a signal period detection means for generating a control signal defining a computer system operating properly condition, and defining a computer system not operating properly condition, wherein said signal period detection means generates said control signal in response to a computer system signal from said computer system bus connector, wherein said computer system operating properly condition is detected when said computer system signal is within a set of prescribed limits,
(d) an alternate computer system bus control means responsive to said control signal for sending a first set of alternate computer system bus signals during said computer system operating properly condition, and for producing a second set of alternate computer system bus signals during said computer not operating properly condition to said alternate computer system bus connector.

10. A system according to claim 9 wherein said alternate computer system bus control means further contains an alternate power connection for providing alternate power to said alternate computer system bus connector and to said signal period detection means during said computer system not operating properly condition.

11. A system according to claim 9 wherein said computer system signal is a computer clock signal supplied from said computer system bus connector.

12. A system according to claim 9 further comprising a DRAM card connected to said alternate computer system bus connector.

13. A system according to claim 12 wherein said alternate computer system bus control means produces said first and second set of alternate computer system bus control signals in a manner such that a transition from said first to second set of alternate computer system bus control signals maintains proper signal timing requirements on said DRAM card attached to said alternate computer system bus.

14. A system according to claim 12 wherein said alternate computer system bus control means produces said first and second set of alternate computer system bus control signals in a manner such that a transition from said second to said set of alternate computer system bus control signals maintains proper signal timing requirements on said DRAM card attached to said alternate computer system bus.

15. A system according to claim 9 further comprising a DRAM subsystem refreshed by said alternate computer system.

16. A system according to claim 9 wherein said signal period detecting means includes a plurality of signal period detectors for detecting periods of a plurality of system signals including said computer system signal.

17. A DRAM controller comprising:
a DRAM connector;
a computer system bus connector;
a signal period detection circuit for detecting period of a computer system signal from said computer system bus connector, said signal period detection circuit generating a first control signal defining a proper operating condition and a second control signal defining an improper operating condition in response to said computer system signal, said improper operating condition occurring when the period of said computer system signal deviates from a set of predetermined parameters; and
an alternate DRAM control circuit for sending a first set of DRAM signals from said computer system bus connector to said DRAM connector during said proper operating condition in response to said first control signal, said alternate DRAM control circuit producing a second set of DRAM signals during said improper operating condition to said DRAM connector in response to said second control signal.

18. A controller according to claim 17 further wherein said computer system signal is a clock signal.

19. A controller according to claim 17 further wherein said computer system signal is a DRAM control signal.

20. A controller according to claim 17 further wherein said alternate DRAM control circuit includes an alternate power connection for providing alternate power to said DRAM connector and to said signal period detection circuit during said improper operating condition.

* * * * *